United States Patent [19]
Jensen et al.

[11] Patent Number: 5,672,967
[45] Date of Patent: Sep. 30, 1997

[54] COMPACT TRI-AXIAL FLUXGATE MAGNETOMETER AND HOUSING WITH UNITARY ORTHOGONAL SENSOR SUBSTRATE

[75] Inventors: Poul A. Jensen; John R. Scherrer, both of San Antonio, Tex.

[73] Assignee: Southwest Research Institute, San Antonio, Tex.

[21] Appl. No.: 531,234

[22] Filed: Sep. 19, 1995

[51] Int. Cl.⁶ .......................... G01R 33/02; G01R 33/04
[52] U.S. Cl. .................... 324/253; 33/361; 324/247
[58] Field of Search .................... 324/244, 245, 324/246, 247, 253–255, 260, 331, 345, 346; 33/355 R, 361, 363 R; 336/65, 90, 92; 244/166

[56] References Cited

U.S. PATENT DOCUMENTS

| | | | |
|---|---|---|---|
| 2,710,942 | 6/1955 | Emerson | 324/247 |
| 3,243,496 | 3/1966 | Silverstein | 174/18 |
| 3,400,328 | 9/1968 | Penn et al. | 324/43 |
| 3,800,213 | 3/1974 | Rorden | 324/43 |
| 4,109,199 | 8/1978 | Ball et al. | 324/202 |
| 4,136,371 | 1/1979 | Moeller | 360/111 |
| 4,182,987 | 1/1980 | Moeller | 324/249 |
| 4,388,592 | 6/1983 | Schonstedt | 324/247 |
| 4,506,221 | 3/1985 | Hayner | 324/256 |
| 4,536,710 | 8/1985 | Dunham | 324/244 |
| 4,683,535 | 7/1987 | de Ridder et al. | 324/249 |
| 4,694,583 | 9/1987 | Blaney | 33/361 |
| 4,907,346 | 3/1990 | Watanabe | 324/253 X |
| 5,134,369 | 7/1992 | Lo et al. | 324/245 |
| 5,142,229 | 8/1992 | Marsden | 324/248 |
| 5,243,403 | 9/1993 | Koo et al. | 356/345 |
| 5,519,318 | 5/1996 | Koerner et al. | 324/247 X |

FOREIGN PATENT DOCUMENTS

| | | |
|---|---|---|
| 0 275 767 A1 | 7/1988 | European Pat. Off. . |
| 3822369 | 6/1989 | Germany ........................ 324/247 |
| 404030 | 3/1974 | U.S.S.R. . |

OTHER PUBLICATIONS

F. Primdahl and P. Anker Jensen "Compact sperical coil for fluxgate magnetometer vector feedback," *J. Phys. E: Sci. Instrum.*, vol. 15, 1982, pp. 221–226.

*Primary Examiner*—Gerard R. Strecker
*Attorney, Agent, or Firm*—Gunn, Lee & Miller, P.C.

[57] ABSTRACT

A tri-axial fluxgate magnetometer and housing therefor that includes elements which facilitate a small sized, relatively low cost magnetometer assembly without sacrificing accuracy and reliability. The assembly includes a unitary sensor substrate capable of orthogonally positioning each of the three fluxgate axes and their respective coils and sensors. The assembly positions the unitary substrate on a circuit board that contains the appropriate harmonic amplifiers, phase detectors, and integrators for signals from each of the three fluxgate axes. A second circuit board positioned parallel to, but apart from, the first, incorporates an appropriate frequency oscillator, frequency divider, and, if necessary, an appropriate voltage regulator. The circuit boards, positioned in parallel as described, are mounted to an end plate that incorporates a signal/control connector and which positions and holds the components of the magnetometer assembly in a generally rectangular configuration. The magnetometer assembly is slid into an extruded tube of rectangular cross section, made of non-ferromagnetic material, that serves to completely enclose the components of the magnetometer and to further position and stabilize them for optimal performance.

4 Claims, 4 Drawing Sheets

COMPACT TRI-AXIAL FLUXGATE MAGNETOMETER AND HOUSING WITH UNITARY ORTHOGONAL SENSOR SUBSTRATE

BACKGROUND OF THE INVENTION

1. Field of the Invention

The present invention relates generally to multi-axis fluxgate magnetometers as well as substrates and housing for such magnetometers. The present invention relates more specifically to a compact tri-axial fluxgate magnetometer for space flight and other similar applications where attitude control and continuous vector measurement of the earth's magnetic field in a three-axis coordinate system is desired.

2. Description of the Related Art

Groups of individual magnetic flux sensors arranged with their axes in mutually orthogonal planes are well known in the art. Such magnetometers are frequently used to determine the sense and/or magnitude of magnetic field vectors and the like. In many instances, such devices are utilized to determine and assist in the maintenance of spacecraft attitude, orientation, and position. In addition, earth-bound facilities often benefit from the use of magnetometers for orientation purposes when accurate directional arrangements are required.

In the past, dual axis and tri-axial magnetometers have been utilized, some of which have employed fluxgate methods for measuring the orientation of the magnetic fields. Use of such fluxgate methods in orientation sensors provides great sensitivity but carries with it a number of disadvantages. In general, those fluxgates that are commercially available tend to be quite large. Miniaturization, therefore, becomes an important consideration and a difficult problem for such applications as spacecraft systems and the like that require very small instrumentation packages. In addition, the sensitivity of fluxgate magnetometers implies very accurate orientation of the axes in the fluxgate assemblies. Very accurate orthogonal positioning is important when use is made of a tri-axial system.

In addition, it is important that the assemblies that include the fluxgate coils and sensors be mounted, housed and aligned in a manner that minimizes the effect of undesirable external factors such as physical shock or alterations in the position and orientation of the systems within which the magnetometer is carried. The problems that have not fully been addressed by the prior art are, therefore, the miniaturization of a stable and accurate orthogonal substrate and its assembly in conjunction with the appropriate electronics and output connectors into a package or enclosure that is for the most part immune to external influences.

U.S. Pat. No. 5,243,403 issued Koo et al. on Sep. 7, 1993, entitled Three-Axis Fibre Optic Magnetometer, describes a fiber optic vector magnetometer, that utilizes a material sensitive to only one direction of a magnetic field (an amorphous metallic glass ribbon material properly annealed) so that three separate sensor elements may be used. This design utilizes a single optical interferometer system and an AC detection scheme to detect the DC magnetic field.

U.S. Pat. No. 5,142,229, issued to Marsden on Aug. 25, 1992, entitled Thin-Film Three-Axis Magnetometer and SQUID Detectors for Use Therein, discloses a magnetometer based upon the use of thin-film SQUID magnetic field detectors deposited on a substrate.

U.S. Pat. No. 5,134,369 issued to Lo et al. on Jul. 28, 1992, entitled Three-Axis Magnetometer Sensor Field Alignment and Registration, describes the process by which each sensor of an array of three-axis magnetometers is aligned and calibrated.

U.S. Pat. No. 4,683,535 issued to de Ridder et al. on Jul. 28, 1987, entitled Thin-Film Magnetometer, discloses a thin-film magnetometer design intended for miniaturization and one in which the sensitivity is not dependent upon the frequency of the applied auxiliary alternating magnetic field. This patent discusses the option of orienting three such thin-film structures having mutually orthogonal orientations, but ties such configurations to use in conjunction with thin film ferromagnetic materials.

U.S. Pat. No. 4,506,221 issued to Haynor on Mar. 19, 1985, entitled Magnetic Heading Transducer having Dual Axis Magnetometer with Electromagnet Mounted to Permit Pivotal Vibration Thereof, describes structures associated with maintaining the relative orientation of a dual axis magnetometer.

U.S. Pat. No. 4,388,592 issued to Schonstedt on Jun. 14, 1983, entitled Multi-Axis Magnetometer Apparatus with Orthogonally Disposed Rectangular Housing for Mounting Separate Sensor Assemblies, describes a magnetometer structural housing that incorporates three separate housings, one for each sensor, and then provides a means for orthogonally connecting and arranging them in appropriate fashion.

U.S. Pat. No. 4,109,199 issued to Ball et al. on Aug. 22, 1978, entitled Three-Axis Magnetometer Calibration Checking Method and Apparatus, describes a method of magnetometer calibration that indirectly addresses structure.

U.S. Pat. No. 3,400,328 issued to Penn et at. on Sep. 3, 1968, entitled An Isotropic Ferromagnetic Thin Film Magnetometer Systems Utilizing a Modulator to Perturb the Field on the Sensitive Axis, describes what is now fairly old technology and reinforces the fact that the electronics associated with magnetometers is fairly well known in the art.

The prior art, therefore, discloses the basic tri-axial magnetometer configuration, but fails to overcome the problems of compactness, simplicity and reliability. The fact that many of the examples of such magnetometers in the prior art describe multi-component mounting systems for the axial sensors and feedback coils is an indication of the effort to achieve accuracy and reliability. Unfortunately, these systems sacrifice compactness and simplicity in the process.

SUMMARY OF THE INVENTION

Accordingly, it is an object of the present invention to provide a tri-axial fluxgate magnetometer that is compact in size and appropriate for use in small spacecraft enclosures and the like.

It is another object of the present invention to provide a tri-axial fluxgate magnetometer that incorporates accurate and stable orthogonal positioning of the fluxgate sensors and coils.

It is another object of the present invention to provide a tri-axial fluxgate magnetometer that provides accurate and stable positioning of the fluxgate sensors and coils through the use of a unitary fluxgate substrate.

It is another object of the present invention to provide a tri-axial fluxgate magnetometer enclosure that minimizes the effects of magnetic fields from circuit elements associated with the electronics of the magnetometer.

It is another object of the present invention to provide a tri-axial fluxgate magnetometer, associated circuitry, and enclosure, capable of a variety of output signal configurations for various applications.

It is another object of the present invention to provide tri-axial fluxgate magnetometer and housing therefore that is small in size, relatively low in cost to manufacture, that does not sacrifice accuracy and reliability for use with aspect sensor measurements and scientific sensor measurements.

In fulfillment of these and other objectives, the present invention provides a tri-axial fluxgate magnetometer and housing therefore that includes elements that provide a small-sized, relatively low cost, magnetometer assembly, without sacrificing accuracy and reliability. The magnetometer assembly includes a unitary sensor substrate capable of orthogonally positioning each of the three fluxgate axes and their respective coils and sensors. The assembly of the present invention positions the unitary substrate on a circuit board that also contains the appropriate harmonic amplifiers, phase detectors, and integrators for signals from each of the three fluxgate axes. A second circuit board in the present invention is positioned parallel to but apart from the first and incorporates an appropriate frequency oscillator, frequency divider, and if necessary, an appropriate voltage regulator. The circuit boards are positioned in parallel as described and are mounted to an end plate that incorporates a signal and control connector and which positions and holds the components of the magnetometer assembly in a generally rectangular configuration. The magnetometer assembly slides into an extruded robe of rectangular cross-section made of non-ferromagnetic material that serves to completely enclose the components of the magnetometer and to further position and stabilize them for optimal performance.

BRIEF DESCRIPTION OF THE DRAWING

The above mentioned features of the invention will become more clearly understood from the following detailed description of the invention read together with the drawings in which.

DESCRIPTION OF THE PREFERRED EMBODIMENT

While there are different uses for the present invention, the specification will describe in detail the structure of a preferred embodiment of the present invention in terms of a specific configuration and packaging most appropriate for use in conjunction with spacecraft applications.

Figure 1:
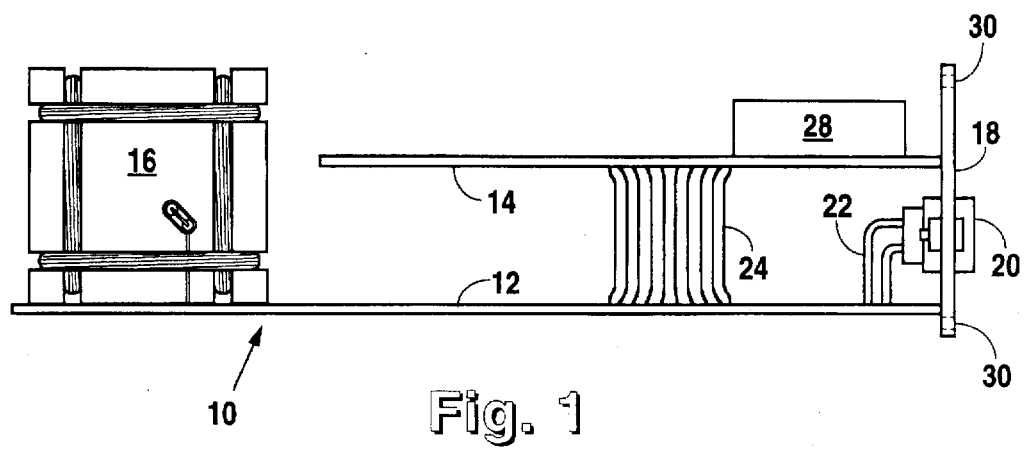
FIG. 1 is a side view of the exposed magnetometer assembly showing the parallel circuit board arrangement, their interconnection, the position of the fluxgate substrate and the fluxgate coils thereon, the external signal/control connector position, and the placement of a voltage regulator component.

Reference is made first to FIG. 1 for a side view of the exposed magnetometer assembly showing the parallel circuit board arrangement, the interconnection between the parallel circuit boards, the positioning of the fluxgate substrate and fluxgate coils thereon, the external connector, and the optional placement of a voltage regulator. Specifically, FIG. 1 shows magnetometer assembly (10) as it is comprised of four primary structural components. Circuit board (12) forms the base structure of assembly (10) and is electrically connected to parallel circuit board (14) by way of a flexible circuit board (24). Parallel circuit boards (12) and (14) are positioned and held in this configuration by slots (114, 122) in the extrusion shown in FIG. 5.

Circuit board (12) is longer than circuit board (14) and provides a mounting position for fluxgate substrate (16) on its extra length. Fluxgate substrate (16), as described in more detail below is a cubicle substrate with dimensions that define at least two of the dimensions of the overall magnetometer assembly.

Additionally mounted to circuit board (14) is an optional voltage regulator component (28). This component is indicated as being optional because in some instances it might be preferable to provide regulated voltages (to power the circuitry) from an external location rather than the internal position shown in FIG. 1. Connector (20) mounted to end-plate (18) has terminal legs (22) connected to circuit board (12). In every case, the output signals generated by the magnetometer circuitry are provided through connector (20) to an external monitoring device. In some instances as mentioned above, a regulated input voltage necessary for the operation of the magnetometer could be provided to the magnetometer circuitry by way of connector (20) as well.

Assembly (10) as shown from the side in FIG. 1 comprises a generally rectangular structure of square cross-section with a length three to five times greater than its width or height. In the preferred embodiment, this structure provides a package with outside dimensions on the order of 35 mm-by-34 mm-by-125 mm. The mass of the package when fully assembled including the enclosures described below is on the order of 150 grams. These dimensions and this mass provide a package suitable for almost any magnetometer application in space flight and many earth-bound magnetometer applications that require miniature packages with very accurate outputs.

Figure 2A:
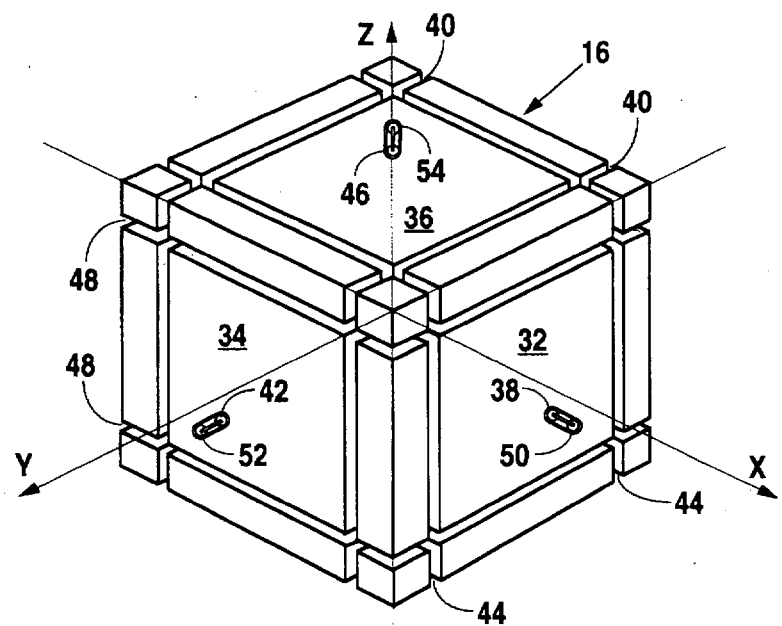
FIG. 2A is a perspective view of the unitary fluxgate substrate showing the orthogonal arrangement of not only the sensor coils, but also the feedback coil pairs. This perspective view discloses the peripheral grooves that are machined into the substrate at right angles to each other, as well as the holes in which the sensor coils are placed.
Figure 2B:
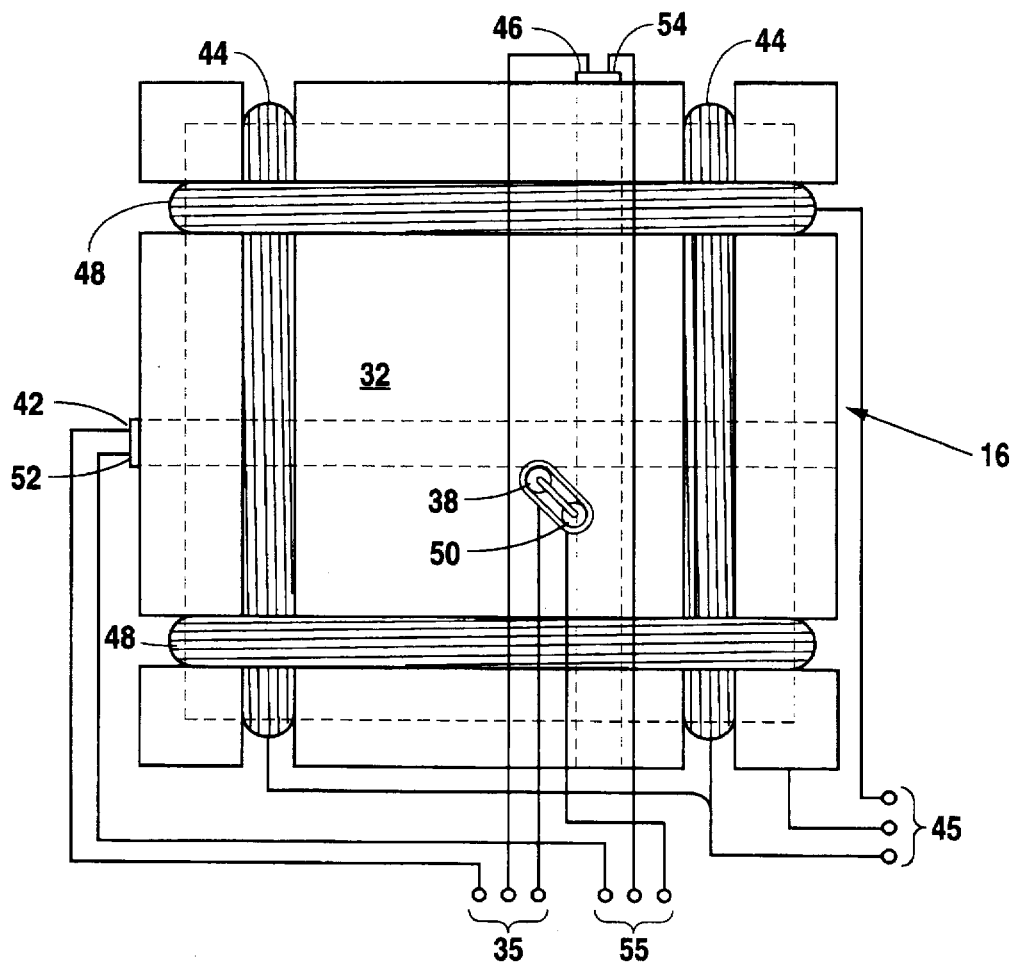
FIG. 2B is a side view of the unitary fluxgate substrate showing the arrangement of the sensor coils, the excitation coils and the feedback coils.

Reference is now made to FIGS. 2A and 2B for a more detailed description of the unitary fluxgate substrate that maintains the orthogonal arrangement of the sensor coils, the excitation coils, and the feedback coils for each of the three axes in the present invention. In the preferred embodiment, the unitary fluxgate substrate (16) is constructed of a machined block of polyphenylene oxide (or NORYL™) material to form a cube to define three sets of parallel faces, each set orthogonally positioned with regard to each of the other two sets. This orthogonally constructed substrate defines the three-axis system for the fluxgate magnetometer.

Machined into substrate (16) are six peripherally positioned grooves that serve to receive and retain the feedback coils for the circuitry of the present invention. These grooves, defined with more specificity below, are machined just deep enough into the faces of the polyphenylene oxide block substrate to hold the appropriate number of coil turns, again as defined with more specificity below. In addition, three holes are drilled into substrate (16) in a manner that permits the positioning of the sensor coil/excitation coil pair.

In FIGS. 2A and 2B, for an x-axis extending normal to face (32) of substrate (16), feedback coils (40) are positioned as indicated. Excitation coil (38) and sensor coil (50) are combined in a structure inserted parallel to the x-axis as defined.

For a y-axis defined normal to face (34) of substrate (16), feedback coils (44) are positioned as indicated. Likewise, excitation coil (42) and sensor coil (52) are combined in a structure inserted into face (34) and positioned along an axis parallel with the y-axis as defined.

Finally, for a z-axis defined normal to face (36) of substrate (16), feedback coils (48) are positioned as indicated. Excitation coil (46) and sensor coil (54) are combined in a structure that is inserted into face (36) so as to be parallel with the z-axis as defined.

Sensor coils (50, 52, and 54) terminate on circuit board (12) at terminals (55). Excitation coils (38, 42, and 46) terminate on circuit board (12) at terminals (35). And, feedback coils (40, 44, and 48) terminate on circuit board (12) at terminals (45).

The method of arranging and positioning the various coils associated with the tri-axial fluxgate magnetometer sensor described in association with FIGS. 2A and 2B, provides a unique stable and accurate platform for the measurement of magnetic field characteristics. The unitary substrate structure permits the assembly of the coils and sensor elements prior to the incorporation of the substrate onto the balance of the assembly of the present invention. Once this orthogonal configuration has been established for each of the coils, no assembly procedures or installation procedures will modify the arrangement. It is the unitary substrate structure that permits accurate orientation of the various coils for the tri-axial fluxgate magnetometer and the maintenance of this orientation throughout the assembly, installation, and use of the magnetometer. In addition, this unitary substrate provides a simple and compact structure for utilization with the circuitry and other components for deriving the magnetic flux characteristics.

Figure 3:
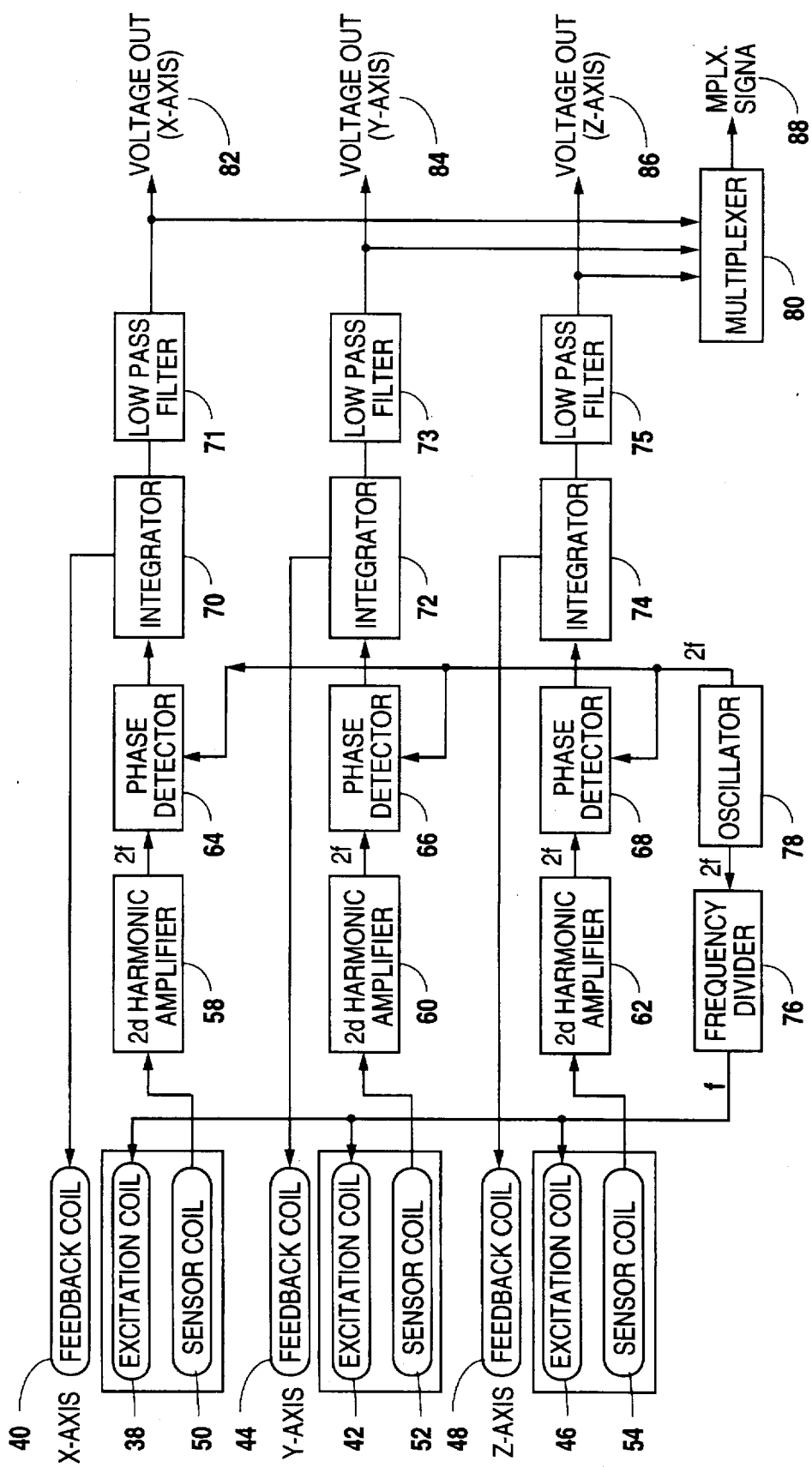
FIG. 3 is a block diagram showing the various electronic components of the magnetometer, their connection to the fluxgate coils, and their output of voltages indicative of field magnitudes.

Reference is now made to FIG. 3 for a detailed description of the basic electronic components of the magnetometer and their connection to the various fluxgate coils described generally above. In FIG. 3, the electronic components associated with each of the three axes of the magnetometer are shown grouped together. Specifically, for the x-axis, excitation coil (38) and sensor coil (50) are shown as they are proximately positioned with regard to each other. Associated therewith is feedback coil (40) for the x-axis. Likewise, excitation coil (42) and sensor coil (52) are associated with the y-axis along with feedback coil (44). Likewise, excitation coil (46) and sensor coil (54) are associated with the z-axis along with feedback coil (48).

Additionally associated with each axis is a second harmonic amplifier, a phase detector, and an integrator for retrieving voltage/current measurements from each of the sensor coils (50, 52, and 54) and providing output back to each of the various feedback coils (40, 44, and 48). Associated with the x-axis are second harmonic amplifier (58), phase detector (64) and integrator (70). Associated with the y-axis are second harmonic amplifier (60), phase detector (66) and integrator (72). Associated with the z-axis are second harmonic amplifier (62), phase detector (68) and integrator (74).

The second harmonic amplifiers (58, 60, and 62) receive a signal from sensor coils (50, 52, and 54) and output a 2f signal to phase detectors (64, 66, and 68). This 2f signal is compared with a 2f signal from oscillator (78) that is provided to each phase detector (64, 66, and 68). The output from phase detectors (64, 66, and 68) is provided to integrators (70, 72, and 74). Integrators thus provide the feedback current to feedback coils (40, 44, and 48). In addition, integrators (70, 72, and 74) provide the voltage signals out through low pass filters (71, 73 and 75) to output terminals (82) for the x-axis, (84) for the y-axis, and (86) for the z-axis. These voltages out are additionally provided to multiplexer (80), which provides a multiplexed signal containing each of these values at terminal (88).

In addition to providing the 2f signal to phase detectors (64, 66, and 68), oscillator (78) provides the 2f signal to frequency divider (76), which in turn provides the f value signal to excitation coils (38, 42, and 46).

The electronic components of the present invention are generally well known in the tri-axial magnetometer field. The components in FIG. 3 identify those fundamental electronic elements necessary for operation of the tri-axial magnetometer and which are incorporated into the package described by the present invention. Some variations in the electronic circuitry of the magnetometer device are possible even while the overall magnetometer assembly would remain within the parameters and profile of the structure of the present invention. Fundamentally, however, the structure of the present invention lends itself to use in conjunction with circuitry that incorporates the use of feedback Helmholtz coils in conjunction with fluxgate sensors for the determination of magnetic field orientations. FIG. 3 describes the basic electronic configuration of just such a system.

Figure 4A:
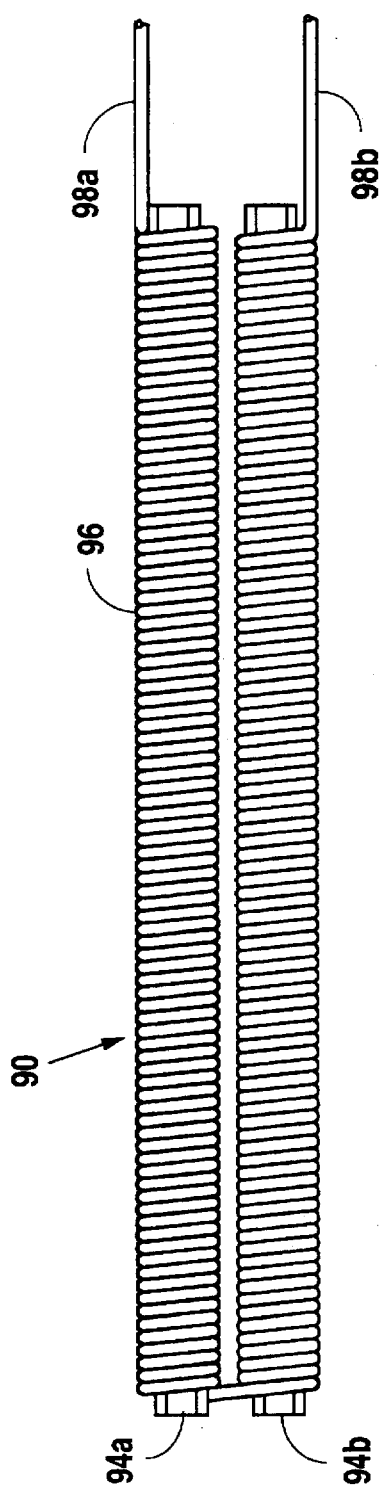
FIG. 4A and 4B are detailed side views of the structure and assembly of each of the fluxgate sensor coils.
Figure 4B:
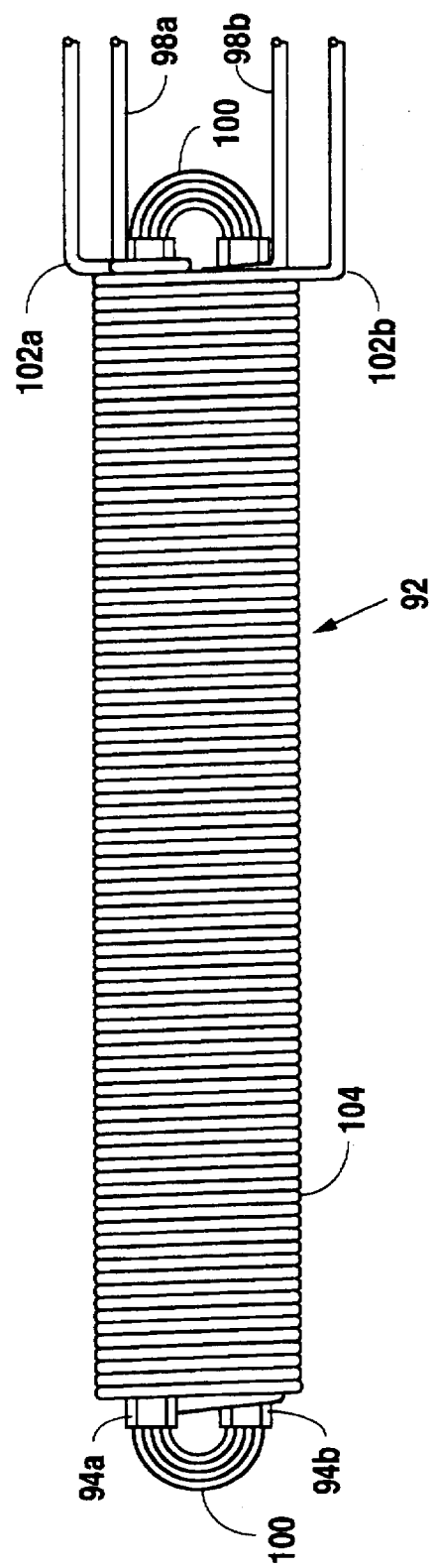

Reference is now made to FIGS. 4A and 4B for a detailed view of the construction of the excitation coil/sensor coil pair generally described above. The objective of the structure shown in FIGS. 4A and 4B is to provide a magnetic material and position the material inside both the excitation coil and the sensor coil in a manner that aligns the coils around the axis on which the magnetic field is to be sensed. Thus, referring back momentarily to FIGS. 2A and 2B, the combination of excitation coil (38) and sensor coil (50), intended to be utilized in conjunction with the x-axis is a structure that extends longitudinally along an axis, parallel or coincident with the x-axis as shown. Thus, the coil pair is constructed on a longitudinal structure that is inserted into the hole drilled into face (32) of substrate (16). As long as this hole is drilled normal to face (32) of substrate (16), the coil pair is positioned appropriately to measure fields along the x-axis as defined.

Referring thus back to FIGS. 4A and 4B, the appropriate coil combination is constructed in two steps as shown. First, in FIG. 4A, excitation coil (96) is wound about a hollow core comprised of core section (94a) and core section (94b). The actual manufacture of this structure (90), shown in FIG. 4A, is accomplished by the initial winding of excitation coil (96) on a single core (not shown) followed by the division of the core into sections (94a) and (94b). These sections are then bent back on themselves retaining the continuity of excitation coil (96) as shown. Terminal ends (98a) and (98b) for excitation coil (96) provide the necessary electrical connections.

Once the excitation coil configuration is constructed as described above, internal magnetic material (100) is positioned within hollow core sections (94a) and (94b). This allows the magnetic material positioned as described above to be in line with the axis to be measured. About the entire structure is wound sensor coil (104) with terminal ends (102a) and (102b). This holds core sections (94a) and (94b) adjacent each other as they have been positioned previously and provides sensor element (92) that is then inserted into each of the three faces of the fluxgate substrate as described above.

It can now be seen that the fluxgate substrate described above and the various coils associated with it, provide a group of nine conductor pairs to the circuitry associated with the magnetometer of the present invention. For each of the three axes, a feedback coil winding pair is provided as well as the excitation coil winding pair and the sensor coil winding pairs associated with the sensor structures defined above. These coil winding pairs are connected to the circuitry as is described with regard to FIG. 3. The encasement of the entire assembly and the positioning of the various elements within the assembly continue the objectives of compact size and stable/accurate outputs.

Referring back to FIG. 1, it can be seen that substrate (16) is positioned at one end of circuit board (12) in a manner that isolates the coils from the remaining components of the circuitry. While these circuit components do not generally create magnetic fields that interfere with these coils, whatever isolation can be accomplished is implemented in the configuration shown. Specifically, a voltage regulator assembly (28) if incorporated into the package of the magnetometer assembly would most often be the single electronic component that might have magnetic materials in it that would adversely affect the coils in the fluxgate sensor structure. Thus, this component is positioned as far from the substrate (16) as possible. The remaining elements of the assembly are comprised of generally non-magnetic materials and, as mentioned above, continue the effort to maintain both structural simplicity, compactness, and stability.

Figure 5:
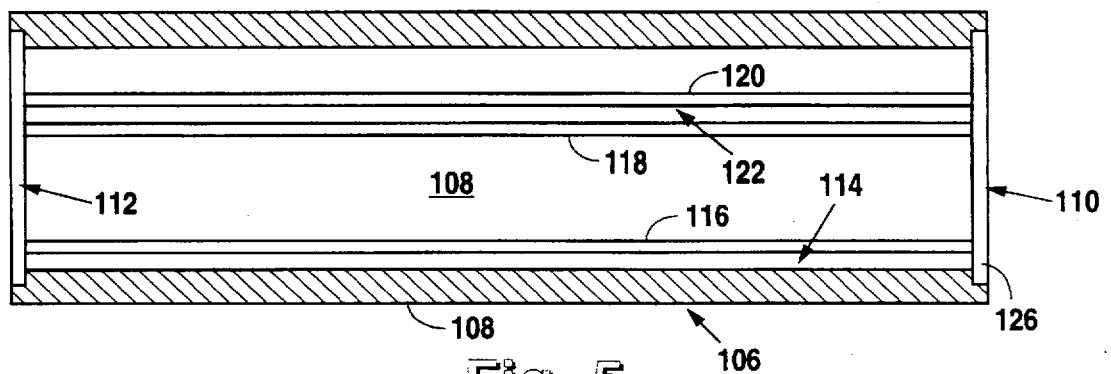
FIG. 5 is a cross-sectional view of the extruded rectangular, tubular housing into which the magnetometer assembly is slid. The ends are shown as open and the appropriate tracks for positioning the two circuit boards are shown across their open face.

FIG. 5 discloses a cross-sectional view of an extruded tubular casing within which the assembly shown in FIG. 1 may be inserted. FIG. 5 discloses in cross-section what is essentially a piece of square conduit shown from one end in FIG. 6, into which the assembly may be slid. Case (106) is comprised of four walls (108) constructed of non-ferromagnetic material. Walls (108) encase assembly (10) on four sides leaving open end sections (110) and (112). End section (112) is covered by a simple square plate (not shown) that is attached to wall sections (108) of case (106). End section (110) is covered by end plate (18) which becomes appropriately positioned to cover end section (110) when magnetometer assembly (10) is inserted within case (106).

Circuit boards (12) and (14) of assembly (10) are retained in rigid parallel orientation by way of slots (114) and (122) in case (106). Slot (114) is defined between wall section (108) and ridge (116), while slot (122) is defined between ridges (118) and (120). Ridges (116, 118, and 120) extend down the entire length of case (106) on each of two walls (108) opposite one another in a manner that retains and directs both edges of each of circuit boards (12) and (14).

Figure 6:
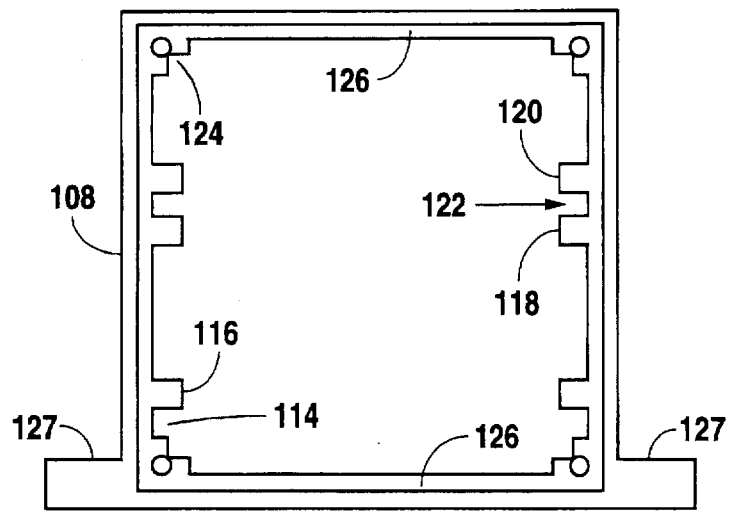
FIG. 6 is an end view of the extruded, rectangular, tubular housing again showing the positioning of the circuit board tracks and the means for attaching the end plates of the magnetometer assembly to the housing.

Reference is made to FIG. 6 for an end view of case (106) describing in detail the structures that receive and stabilize the components of magnetometer assembly (10). As shown also in FIG. 5, case (106) is comprised of four wall sections (108). Extending down the length of two opposing wall sections (108) are slots (122) and (114) defined by ridges (116, 118, and 120) as described above. As shown from the end in FIG. 6, these slots (114) and (122) are positioned to receive circuit boards (12) and (14). At the end section shown in FIG. 5 and FIG. 6, indentation (126) is provided to receive either the end plate (not shown) described above with end section (112) or end plate (18) described as being associated with end section (110). In any event, these end plates are retained and attached to case (106) by way of screws (not shown) at threaded apertures (124).

The completed magnetometer instrument incorporates magnetometer assembly (10) within case (106) with attached end plates as described, to form a generally rectangular box closed at all points, except for the positioning of connector (20) on end plate (18). Mounting flanges (127) are incorporated in case (106) to facilitate the attachment of the instrument to the vehicle or device it is to be utilized in conjunction with.

While a preferred embodiment has been shown and described, it will be understood that it is not intended to limit the disclosure, but rather it is intended to cover all modifications and alternate methods falling within the spirit and the scope of the invention as defined in the appended claims or their equivalents.

In summary, the present invention provides two distinct areas of fundamental improvement over the prior art. First, the unitary fluxgate substrate provides the ability to orthogonally position the various fluxgate coils. Second, the overall arrangement and assembly of the elements of the magnetometer in a structural package facilitates the objectives of the invention, most importantly reliability, simplicity, and low cost.

We claim:

1. A tri-axial fluxgate magnetometer assembly comprising:
   a unitary sensor substrate defining three orthogonally oriented axes;
   a plurality of fluxgate coils positioned on said three orthogonally oriented axes of said unitary sensor substrate, said fluxgate coils including:
   a plurality of excitation coils, each of said excitation coils wound about a core of magnetic material;
   a plurality of sensor coils, each of said sensor coils wound about one of said excitation coils; and
   a plurality of feedback coils;
   said plurality of fluxgate coils serving as a Helmholtz coil feedback/sensor configuration for measuring magnetic flux along each of said axes;
   a first and a second circuit board, said circuit boards positioned in a fixed, parallel, overlapping, and spaced orientation with respect to each other;
   electronic coil sensing and driving circuitry connected with said plurality of fluxgate coils for detecting said magnetic flux and outputting a voltage signal indicative of said magnetic flux in each of said plurality of axes, said electronic circuitry positioned on said second circuit board and at a first end of said first circuit board and said plurality of fluxgate coils on said unitary sensor substrate positioned at a distal second end of said first circuit board; and
   an enclosure of non-magnetic material for surrounding said plurality of fluxgate coils on said unitary sensor substrate and said electronic circuitry on said first and said second circuit boards, said enclosure serving to stabilize and position said substrate, said coils, and said circuit boards in a fixed orientation.

2. The assembly of claim 1, further comprising an end plate oriented perpendicular to each of said circuit boards and attached to each of said circuit boards in a manner that maintains said circuit boards in a generally parallel relationship to each other, said end plate further comprising an external connector for providing said voltage output signals.

3. The assembly of claim 2, wherein said enclosure comprises;

a conduit section of rectangular cross-section defined by four conduit walls and defining a first and a second open end;

an end cover removably attached to said first open end of said conduit; and a plurality of longitudinal ridges on internal faces of two opposing walls of said conduit, said ridges defining slots within which said circuit boards of said magnetometer assembly are positioned and retained;

wherein said end plate attached to said circuit boards also serves to close said second open end of said conduit.

4. A tri-axial fluxgate magnetometer assembly comprising:

a unitary sensor substrate defining three orthogonally oriented axes, said unitary sensor substrate comprising;

a generally cubical block of non-ferromagnetic material, said block comprising;

a plurality of peripheral grooves machined into each of the six faces of said block; and a plurality of axial channels, one of said axial channels drilled into each of three faces of said block, said axial channels aligned parallel to said three orthogonally oriented axes;

a plurality of fluxgate coils positioned on said three orthogonally oriented axes of said unitary sensor substrate, said fluxgate coils including;

a plurality of excitation coils, each of said excitation coils wound about a core of magnetic material;

a plurality of sensor coils, each of said sensor coils wound about one of said excitation coils; and a plurality of feedback coils;

said plurality of fluxgate coils serving as a Helmholtz coil feedback/sensor configuration for measuring magnetic flux along each of said axes;

electronic coil sensing and driving circuitry connected with said plurality of fluxgate coils for detecting said magnetic flux and outputting a voltage signal indicative of said magnetic flux in each of said plurality of axes;

a first and a second circuit board, said electronic coil sensing and driving circuitry positioned on said first and said second circuit boards and said sensor substrate mounted at a distal end of said first circuit board;

an end plate oriented perpendicular to each of said circuit boards and attached to each of said circuit boards in a manner that maintains said circuit boards in a generally parallel relationship to each other, said end plate further comprising an external connector for providing said voltage output signals; and an enclosure of non-magnetic material for surrounding said plurality of fluxgate coils on said unitary sensor substrate and said electronic circuitry on said circuit boards, said enclosure comprising;

a conduit section of rectangular cross-section defined by four conduit walls and defining a first and a second open end;

an end cover removably attached to said first open end of said conduit; and a plurality of longitudinal ridges on internal faces of two opposing walls of said conduit, said ridges defining slots within which said circuit boards of said magnetometer assembly are positioned and retained;

wherein said end plate attached to said circuit boards also serves to close said second open end of said conduit.

* * * * *